United States Patent
Grumbine et al.

(10) Patent No.: US 9,028,572 B2
(45) Date of Patent: May 12, 2015

(54) POLISHING COMPOSITION AND METHOD UTILIZING ABRASIVE PARTICLES TREATED WITH AN AMINOSILANE

(75) Inventors: Steven Grumbine, Aurora, IL (US); Shoutian Li, Naperville, IL (US); William Ward, Glen Ellyn, IL (US); Pankaj Singh, Plainfield, IL (US); Jeffrey Dysard, St. Charles, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 831 days.

(21) Appl. No.: 12/234,237

(22) Filed: Sep. 19, 2008

(65) Prior Publication Data

US 2009/0081927 A1    Mar. 26, 2009

Related U.S. Application Data

(60) Provisional application No. 60/974,328, filed on Sep. 21, 2007.

(51) Int. Cl.
*C09K 3/14* (2006.01)
*B24B 37/04* (2012.01)
*C09G 1/02* (2006.01)
*H01L 21/3105* (2006.01)

(52) U.S. Cl.
CPC ............. *C09K 3/1463* (2013.01); *B24B 37/044* (2013.01); *C09G 1/02* (2013.01); *H01L 21/31053* (2013.01)

(58) Field of Classification Search
CPC ...... B24B 37/044; C09G 1/02; C09K 3/1463; H01L 21/31053
USPC .................................................. 421/36; 106/3
See application file for complete search history.

(56) References Cited

U.S. PATENT DOCUMENTS

| | | | |
|---|---|---|---|
| 5,174,813 A | 12/1992 | Cifuentes et al. | |
| 5,196,353 A | 3/1993 | Sandhu et al. | |
| 5,230,833 A | 7/1993 | Romberger et al. | |
| 5,385,975 A | 1/1995 | Nakamura et al. | |
| 5,428,107 A | 6/1995 | Tysak et al. | |
| 5,433,651 A | 7/1995 | Lustig et al. | |
| 5,489,233 A | 2/1996 | Cook et al. | |
| 5,527,423 A | 6/1996 | Neville et al. | |
| 5,609,511 A | 3/1997 | Moriyama et al. | |
| 5,643,046 A | 7/1997 | Katakabe et al. | |
| 5,645,736 A | 7/1997 | Allman | |
| 5,658,183 A | 8/1997 | Sandhu et al. | |
| 5,730,642 A | 3/1998 | Sandhu et al. | |
| 5,767,016 A | 6/1998 | Muroyama | |
| 5,770,103 A | 6/1998 | Wang et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,062,968 A | 5/2000 | Sevilla et al. | |
| 6,117,000 A | 9/2000 | Anjur et al. | |
| 6,126,532 A | 10/2000 | Sevilla et al. | |
| 6,136,711 A | 10/2000 | Grumbine et al. | |
| 6,372,648 B1 | 4/2002 | Hall et al. | |
| 6,582,623 B1 * | 6/2003 | Grumbine et al. | 252/79.1 |
| 6,620,216 B2 * | 9/2003 | Oshima et al. | 51/309 |
| 6,646,348 B1 | 11/2003 | Grumbine et al. | |
| 6,656,241 B1 * | 12/2003 | Hellring et al. | 51/308 |
| 6,730,245 B2 | 5/2004 | Hampden-Smith et al. | |
| 6,910,952 B2 * | 6/2005 | Suenaga et al. | 451/41 |
| 6,992,123 B2 * | 1/2006 | Shiho et al. | 524/17 |
| 7,038,633 B2 | 5/2006 | Eriksson | |
| 7,044,836 B2 | 5/2006 | Sun et al. | |
| 7,217,989 B2 | 5/2007 | Hiramitsu et al. | |
| 7,265,055 B2 | 9/2007 | Thompson | |
| 8,252,687 B2 * | 8/2012 | Li et al. | 438/692 |
| 2004/0152309 A1 * | 8/2004 | Carter et al. | 438/689 |
| 2004/0209555 A1 * | 10/2004 | Sun et al. | 451/41 |
| 2005/0012658 A1 | 1/2005 | Eriksson | |
| 2006/0084270 A1 | 4/2006 | Hiramitsu et al. | |

FOREIGN PATENT DOCUMENTS

| | | | | |
|---|---|---|---|---|
| JP | 2002-294220 | * | 10/2002 | ............... C09K 3/14 |
| JP | 2002294220 A | | 10/2002 | |
| JP | 2006147993 A | | 6/2006 | |
| TW | 539741 B | | 7/2003 | |
| WO | WO 2005/075579 A1 | | 8/2005 | |

* cited by examiner

*Primary Examiner* — Shuangyi Abu Ali
(74) *Attorney, Agent, or Firm* — Thomas E Omholt; Nancy J Gettel; Arlene Hornilla

(57) ABSTRACT

The inventive method comprises chemically-mechanically polishing a substrate with an inventive polishing composition comprising a liquid carrier and abrasive particles that have been treated with a compound.

7 Claims, No Drawings

POLISHING COMPOSITION AND METHOD UTILIZING ABRASIVE PARTICLES TREATED WITH AN AMINOSILANE

CROSS-REFERENCE TO RELATED APPLICATIONS

This patent application claims the benefit of U.S. Provisional Patent Application No. 60/974,328, filed Sep. 21, 2007, which is incorporated by reference.

BACKGROUND OF THE INVENTION

Compositions and methods for polishing (e.g., planarizing) the surface of a substrate are well known in the art. Polishing compositions (also known as polishing slurries, CMP slurries, and CMP compositions) typically contain an abrasive material in an aqueous solution and are applied to a surface by contacting the surface with a polishing pad saturated with the polishing composition. Typical abrasive materials include metal oxide particles, such as silicon dioxide, cerium oxide, aluminum oxide, zirconium oxide, and tin oxide. U.S. Pat. No. 5,527,423, for example, describes a method for chemically-mechanically polishing (CMP) a metal layer by contacting the surface with a polishing composition comprising high purity fine metal oxide particles in an aqueous medium. The polishing composition is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern.

A semiconductor wafer typically includes a substrate, such as silicon or gallium arsenide, on which a plurality of transistors have been formed. Transistors are chemically and physically connected to the substrate by patterning regions in the substrate and layers on the substrate. The transistors and layers are separated by interlevel dielectrics (ILDs), comprised primarily of some form of silicon oxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon.

Chemical-mechanical polishing is used to planarize the surface of the metal layers or thin-films during the various stages of device fabrication. Many of the known CMP compositions are suitable for limited purposes. However, the conventional CMP compositions tend to exhibit unacceptable polishing rates and selectivity levels with respect to insulator materials used in wafer manufacture. In addition, many CMP compositions tend to exhibit poor film removal traits for the underlying films or produce deleterious film-corrosion, which leads to poor manufacturing yields.

As the technology for integrated circuit devices advances, traditional materials are being used in new and different ways to achieve the level of performance needed for advanced integrated circuits. In particular, silicon nitride and silicon oxide are being used in various combinations to achieve new and ever more complex device configurations. In general, the structural complexity and performance characteristics vary across different applications. There is an ongoing need for methods and compositions that allow for the removal rates of various layers (e.g., silicon nitride, silicon oxide) to be adjusted or tuned during CMP to meet the polishing requirements for particular devices. The present invention provides such improved polishing methods and compositions. These and other advantages of the invention, as well as additional inventive features, will be apparent from the description of the invention provided herein.

BRIEF SUMMARY OF THE INVENTION

The invention provides a method of chemically-mechanically polishing a substrate, which method comprises (i) contacting a substrate with a chemical-mechanical polishing composition comprising (a) a liquid carrier (b) an abrasive suspended in the liquid carrier, wherein the abrasive comprises metal oxide particles having a surface which has been treated with a compound selected from the group consisting of an aminosilane compound, a phosphononiumsilane compound, and a sulfonium silane compound, and (c) an acid selected from the group consisting of a phosphonic acid and a boron containing acid, (ii) moving the polishing composition relative to the substrate, and (iii) abrading at least a portion of the substrate to polish the substrate.

The invention also provides a method of chemically-mechanically polishing a substrate, which method comprises (i) contacting a substrate with a chemical-mechanical polishing composition comprising (a) a liquid carrier and (b) an abrasive suspended in the liquid carrier, wherein the abrasive comprises metal oxide particles having a surface which has been treated with a compound selected from the group consisting of quaternary aminosilane compounds, dipodal aminosilane compounds, and combinations thereof, (ii) moving the polishing composition relative to the substrate, and (iii) abrading at least a portion of the substrate to polish the substrate.

The invention further provides a chemical-mechanical polishing composition for polishing a substrate comprising (a) a liquid carrier, (b) an abrasive suspended in the liquid carrier, wherein the abrasive comprises metal oxide particles having a surface which has been treated with a compound selected from the group consisting of an aminosilane compound, a phosphononiumsilane compound, and a sulfonium silane compound, and (c) an acid selected from the group consisting of a phosphonic acid and a boron containing acid.

The invention additionally provides a chemical-mechanical polishing composition for polishing a substrate comprising (a) a liquid carrier and (b) an abrasive suspended in the liquid carrier, wherein the abrasive comprises metal oxide particles having a surface which has been treated with an aminosilane compound selected from the group consisting of quaternary aminosilane compounds, dipodal aminosilane compounds, and combinations thereof.

The invention also comprises a chemical-mechanical polishing composition for polishing a substrate comprising a liquid carrier, and an abrasive suspended in the liquid carrier, wherein the abrasive comprises metal oxide particles having a surface which has been treated with a compound selected from the group consisting of an aminosilane compound, a phosphoniumsilane compound, and a sulfonium silane compound, wherein the treated abrasive particles have a surface coverage of the available silanols of about 2% to about 50%.

DETAILED DESCRIPTION OF THE INVENTION

The invention provides a chemical-mechanical polishing composition as well as a method of chemically-mechanically polishing a substrate. The polishing composition comprises (a) a liquid carrier and (b) an abrasive suspended in the liquid carrier, wherein the abrasive comprises metal oxide particles having a surface which has been treated with a compound selected from the group consisting of an aminosilane compound such as aminosilane compounds, dipodal aminosilane compounds, phosphononiumsilane compounds, sulfonium silane compounds, and combinations thereof. The composition can also comprise an acid selected from the group consisting of a phosphonic acid and a boron containing acid. Further, the composition can comprise treated abrasive particles wherein the particles have a surface coverage of the available silanols of about 2% to about 50%. The method comprises contacting a substrate with the chemical-mechanical polishing composition, moving the polishing composition relative to the substrate, and abrading at least a portion of the substrate to polish the substrate.

The polishing method can further comprise contacting the substrate with a polishing pad (e.g., polishing surface), which is moved relative to the substrate with the polishing composition therebetween. The polishing pad can be any suitable polishing pad, many of which are known in the art. Suitable polishing pads include, for example, woven and non-woven polishing pads. Moreover, suitable polishing pads can comprise any suitable polymer or combination of polymers of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The polishing pad can comprise fixed abrasive particles on or within the polishing surface of the polishing pad, or the polishing pad can be free or substantially free of fixed abrasive particles. Fixed abrasive polishing pads include pads having abrasive particles affixed to the polishing surface of the polishing pad by way of an adhesive, binder, ceramer, resin, or the like or abrasives that have been impregnated within a polishing pad so as to form an integral part of the polishing pad, such as, for example, a fibrous batt impregnated with an abrasive-containing polyurethane dispersion.

The polishing pad can have any suitable configuration. For example, the polishing pad can be circular and, when in use, typically will have a rotational motion about an axis perpendicular to the plane defined by the surface of the pad. The polishing pad can be cylindrical, the surface of which acts as the polishing surface, and, when in use, typically will have a rotational motion about the central axis of the cylinder. The polishing pad can be in the form of an endless belt, which, when in use, typically will have a linear motion with respect to the cutting edge being polished. The polishing pad can have any suitable shape and, when in use, have a reciprocating or orbital motion along a plane or a semicircle. Many other variations will be readily apparent to the skilled artisan.

The polishing composition comprises an abrasive, which desirably is suspended in the liquid carrier (e.g., water). The abrasive typically is in particulate form. Preferably, the abrasive comprises, consists essentially of, or consists of silica particles, especially colloidal silica particles. Colloidal silica particles are prepared via a wet process and typically are non-aggregated, individually discrete particles, which generally are spherical or nearly spherical in shape, but can have other shapes (e.g., shapes with generally elliptical, square, or rectangular cross-sections). Such particles typically are structurally different from fumed particles, which are prepared via a pyrogenic or flame hydrolysis process and are chain-like structures of aggregated primary particles.

Preferably, the colloidal silica is precipitated or condensation-polymerized silica, which can be prepared using any method known to those of ordinary skill in the art, such as by the sol gel method or by silicate ion-exchange. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products such as the BINDZIL 50/80, 30/310, and 40/130 products from EKA Chemicals, the Fuso PL-1, PL-2, PL-3, and PL-3H products, and the Nalco 1034A, 1050, 2327, and 2329 products, as well as other similar products available from DuPont, Bayer, Applied Research, Nissan Chemical (the SNOWTEX products), and Clariant.

The particle size of a particle is the diameter of the smallest sphere that encompasses the particle. The abrasive particles can have any suitable particle size. The abrasive particles have an average particle size of about 5 nm or more (e.g., about 10 nm or more, about 15 nm or more, about 20 nm or more, or about 30 nm or more). The abrasive particles can have an average particle size of about 150 nm or less (e.g., about 130 nm or less, about 80 nm or less, about 50 nm or less, or about 30 nm or less). Accordingly, the abrasive particles can have an average particle size of about 10 nm to about 150 nm (e.g., about 20 nm to about 130 nm, about 15 nm to about 100 nm, about 20 nm to about 80 nm, or about 20 nm to about 60 nm).

Any suitable amount of abrasive can be present in the polishing composition. Typically, about 0.01 wt. % or more (e.g., about 0.05 wt. % or more) abrasive will be present in the polishing composition. More typically, about 0.1 wt. % or more (e.g., about 0.2 wt. % or more, about 0.3 wt. % or more, about 0.6 wt. % or more, about 1 wt. % or more, or about 2 wt. % or more) abrasive will be present in the polishing composition. The amount of abrasive in the polishing composition typically will be about 30 wt. % or less, more typically will be about 20 wt. % or less (e.g., about 15 wt. % or less, about 10 wt. % or less, about 5 wt. % or less, about 3 wt. % or less, or about 2 wt. % or less). Preferably, the amount of abrasive in the polishing composition is about 0.01 wt. % to about 20 wt. %, and more preferably about 0.05 wt. % to about 15 wt. % (e.g., about 0.1 wt. % to about 10 wt. %, about 0.1 wt. % to about 5 wt. %, about 0.1 wt. % to about 3 wt. %, about 0.1 wt. % to about 2 wt. %, or about 0.2 wt. % to about 2 wt. %).

The abrasive is treated with at least one silane compound, aminosilane compound, phosphononiumsilane compound, or sulfonium silane compound. Suitable silane compounds include primary aminosilanes, secondary aminosilanes, tertiary aminosilanes, quaternary aminosilanes, and dipodal aminosilanes. The aminosilane compound can be any suitable aminosilane, such as aminopropyl trialkoxysilane, bis(2-hydroxyethyl)-3-aminopropyl trialkoxysilane, diethylaminomethyltrialkoxysilane, (N,N-diethyl-3-aminopropyl) trialkoxysilane, 3-(N-styrylmethyl)-2-aminoethylaminopropyl trialkoxysilane, 2-(N-benzylaminoethyl)-3-aminopropyl trialkoxysilane, trialkoxysilyl propyl-N,N,N-trimethyl ammonium chloride, N-(trialkoxysilylethyl)benzyl-N,N,N-trimethyl ammonium chloride, bis(methyldialkoxysilylpropyl)-N-methyl amine, bis(trialkoxysilylpropyl) urea, bis(3-(trialkoxysilyl)propyl)-ethylenediamine, and bis (trialkoxysilylpropyl)amine. The alkoxy groups in the above aminosilane compounds can be substituted by other hydrolyzable groups such as halides, amines and carboxylates.

Preferably, the silane is dipodal or tripodal. The choice of silane compound depends, in part, on the type of substrate that is being polished.

Preferably, the treated abrasive particles have a particle size which is the same as or slightly larger than the untreated abrasive particles. Any increase in particle size of the treated abrasive particles is preferably about 2 times that of the untreated particles or less (e.g., about 1.7 times that of the untreated particles or less, about 1.4 times that of the untreated particles or less, or about 1.2 times that of the untreated particles or less). For example, the treated abrasive particles have an average particle size of about 5 nm or more (e.g., about 10 nm or more, about 15 nm or more, about 20 nm or more, or about 30 nm or more). The treated abrasive particles can have an average particle size of about 150 nm or less (e.g., about 130 nm or less, about 80 nm or less, about 50 nm or less, or about 30 nm or less). Accordingly, the treated abrasive particles can have an average particle size of about 10 nm to about 150 nm (e.g., about 20 nm to about 130 nm, about 15 nm to about 100 nm, about 20 nm to about 80 nm, or about 20 nm to about 60 nm).

Any suitable method of treating the abrasive, many of which are known to those of ordinary skill in the art, can be used. For example, the abrasive can be treated with the aminosilane compound before mixing with the other components of the polishing composition, or the aminosilane and the abrasive can be added simultaneously to some or all of the other components of the polishing composition.

It is preferred that the silane with which the particle is treated does not cover all of the available silanol sites on the particle. Typically, the treated abrasive particles have a surface coverage of the available silanols of about 2% or more (e.g., about 4% or more, about 8% or more). The treated abrasive particles preferably have a surface coverage of the available silanols of about 50% or less (e.g., about 30% or less, about 20% or less, or about 10% or less). Preferably, the treated abrasive particles have a surface coverage of the available silanols of about 2% to about 50% (e.g., about 2% to about 30%, about 2% to about 20%, or about 4% to about 15%). The surface silanol concentration can be estimated using a typical value of 5 SiOH/nm$^2$ for silica and the BET surface area of the silica.

The aminosilane compound can be present in the polishing composition in any suitable amount. Typically, the polishing composition comprises about 30 ppm or more (e.g., about 50 ppm or more, about 100 ppm or more, about 200 ppm or more, about 300 ppm or more, about 400 ppm or more, or about 500 ppm or more) aminosilane compound. The polishing composition preferably comprises about 2000 ppm or less (e.g., about 1000 ppm or less, about 800 ppm or less, or about 600 ppm or less) aminosilane compound. Preferably, the polishing composition comprises about 50 ppm to about 2000 ppm (e.g., about 100 ppm to about 1000 ppm, about 200 ppm to about 800 ppm, about 250 ppm to about 700 ppm, or about 275 ppm to about 600 ppm) aminosilane compound.

The zeta potential of a particle refers to the difference between the electrical charge of the ions surrounding the particle and the electrical charge of the bulk solution (e.g., the liquid carrier and any other components dissolved therein). If the abrasive is silica, before the abrasive is treated with the aminosilane compound, it has a zeta potential of zero at a pH of about 2 to about 3. After treatment with the aminosilane compound, the treated abrasive particles has a positive charge, and thus a positive zeta potential. Typically, the treated abrasive particles have a zeta potential of about 5 mV or more (e.g., about 10 mV or more, about 15 mV or more, about 20 mV or more, about 25 mV or more, or about 30 mV or more). The treated abrasive particles preferably have a zeta potential of about 50 mV or less (e.g., about 45 mV or less, about 40 mV or less, or about 35 mV or less). Preferably, the treated abrasive particles have a zeta potential of about 5 mV to about 50 mV (e.g., about 10 mV to about 45 mV, about 15 mV to about 40 mV, or about 20 mV to about 40 mV).

A liquid carrier is used to facilitate the application of the abrasive and any optional additives to the surface of a suitable substrate to be polished (e.g., planarized). The liquid carrier can be any suitable carrier (e.g., solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The polishing composition also may contain an acid, which can be any suitable acid. The acid used will depend, in part, on the type of substrate being polished. For example, the acid can be phthalic acid, nitric acid, a boron-containing acid such as boric acid, or a phosphorus-containing acid, such as 1-hydroxyethylidene-1,1-diphosphonic acid (e.g., DEQUEST 2010), amino tri(methylene phosphonic acid) (e.g., DEQUEST 2000), phosphoric acid, or combinations thereof. The acid can be present in the polishing composition in any suitable amount. Typically, the polishing composition comprises about 10 ppm or more (e.g., about 20 ppm or more, about 30 ppm or more, about 50 ppm or more, about 100 ppm or more, about 150 ppm or more, about 300 ppm or more, or about 500 ppm or more) acid. The polishing composition preferably comprises about 3000 ppm or less (e.g., about 2000 ppm or less, about 1500 ppm or less, or about 1000 ppm or less) acid. Preferably, the polishing composition comprises about 10 ppm to about 3000 ppm (e.g., about 20 ppm to about 2000 ppm, about 30 ppm to about 1500 ppm, about 50 ppm to about 1000 ppm, or about 100 ppm to about 1000 ppm) acid. The preferred acid depends, in part, on the pH of the polishing composition.

The polishing composition also may comprise an oxidizing agent, which can be any suitable oxidizing agent for one or more materials of the substrate to be polished with the polishing composition. Preferably, the oxidizing agent is selected from the group consisting of bromates, bromites, chlorates, chlorites, hydrogen peroxide, hypochlorites, iodates, hydroxylamine salts, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof. The oxidizing agent can be present in the polishing composition in any suitable amount. Typically, the polishing composition comprises about 0.01 wt. % or more (e.g., about 0.02 wt. % or more, about 0.1 wt. % or more, about 0.5 wt. % or more, or about 1 wt. % or more) oxidizing agent. The polishing composition preferably comprises about 20 wt. % or less (e.g., about 15 wt. % or less, about 10 wt. % or less, or about 5 wt. % or less) oxidizing agent. Preferably, the polishing composition comprises about 0.01 wt. % to about 20 wt. % (e.g., about 0.05 wt. % to about 15 wt. %, about 0.1 wt. % to about 10 wt. %, about 0.3 wt. % to about 6 wt. %, or about 0.5 wt. % to about 4 wt. %) oxidizing agent.

The polishing composition, specifically the liquid carrier with any components dissolved or suspended therein, can have any suitable pH. The polishing composition can have a pH of less than about 9 (e.g., about 8 or less, about 7 or less, about 6 or less, about 5 or less, about 4.5 or less, or about 4 or less). The polishing composition can have a pH of about 1 or more (e.g., about 1.5 or more, about 3 or more, about 4 or more, about 5 or more, about 7 or more, or about 8 or more). The pH can be, for example, from about 1 to about 7 (e.g., from about 1.5 to about 6, from about 1.5 to about 5, or from about 2 to about 4). The pH can be, for example, from about 3 to about 8 (e.g., from about 3.5 to about 6, or from about 4.5 to about 6.5). The pH can be, for example, from about 7 to about 9 (e.g., from about 7.5 to about 8.5).

The pH of the polishing composition can be achieved and/or maintained by any suitable means. More specifically, the polishing composition can further comprise a pH adjustor, a pH buffering agent, or a combination thereof. The pH adjustor can comprise, consist essentially of, or consist of any suitable pH-adjusting compound. For example, the pH adjustor can be the acid of the polishing composition. The pH buffering agent can be any suitable buffering agent, for example, phosphates, acetates, borates, sulfonates, carboxylates, ammonium salts, amino acids, and the like. The capability of a buffering agent depends on factors such as its pKa, (negative logarithm of the acid dissociation constant) and concentration. For optimal buffering it is preferred that the buffering agent has a pKa within about 1 unit of the pH of the polishing composition. The polishing composition can comprise any suitable amount of a pH adjustor and/or a pH buffering agent, provided such amount is sufficient to achieve and/or maintain the desired pH of the polishing composition, e.g., within the ranges set forth herein.

It is preferred that the polishing composition has low conductivity. Conductivity is the property of a substance that describes its ability to transfer electricity. In electrolytic solutions, the current is carried by the ions in solution such as acids, bases and salts. The conductivity in the polishing composition preferably is about 1500 µS/cm or less (e.g., about 900 µS/cm or less, about 600 µS/cm or less, or about 300 µS/cm or less). The conductivity in the polishing composition preferably is about 30 µS/cm or more (e.g., about 60 µS/cm or more, about 100 µS/cm or more). Preferably, the conductivity in the polishing composition preferably is about 30 µS/cm to about 1500 µS/cm (e.g., about 30 µS/cm to about 900 µS/cm, about 60 µS/cm to about 600 µS/cm).

The polishing composition optionally comprises a corrosion inhibitor (i.e., a film-forming agent). The corrosion inhibitor can comprise, consist essentially of, or consist of any suitable corrosion inhibitor. Preferably, the corrosion inhibitor is an azole compound. The amount of corrosion inhibitor used in the polishing composition typically is about 0.0001 wt. % to about 3 wt. % (preferably about 0.001 wt. % to about 2 wt. %) based on the total weight of the polishing composition.

The polishing composition optionally comprises a chelating or complexing agent. The complexing agent is any suitable chemical additive that enhances the removal rate of the substrate layer being removed, or that removes trace metal contaminants in silicon polishing. Suitable chelating or complexing agents can include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, oxalic acid, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like), and amine-containing compounds (e.g., ammonia, amino acids, amino alcohols, di-, tri-, and polyamines, and the like). The choice of chelating or complexing agent will depend on the type of substrate layer being removed.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof, phthalates include phthalic acid, as well as mono-salts (e.g., potassium hydrogen phthalate) and di-salts thereof; perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The polishing composition optionally further comprises one or more other additives. Such additives include acrylates comprising one or more acrylic subunits (e.g., vinyl acrylates and styrene acrylates), and polymers, copolymers, and oligomers thereof, and salts thereof.

The polishing composition can comprise a surfactant and/or rheological control agent, including viscosity enhancing agents and coagulants (e.g., polymeric rheological control agents, such as, for example, urethane polymers). Suitable surfactants can include, for example, cationic surfactants, anionic surfactants, nonionic surfactants, amphoteric surfactants, mixtures thereof, and the like. Preferably, the polishing composition comprises a nonionic surfactant. Preferred nonionic surfactants contain a polyether moiety. One example of a suitable nonionic surfactant is an ethylenediamine polyoxyethylene surfactant. The amount of surfactant in the polishing composition typically is about 0.0001 wt. % to about 1 wt. % (preferably about 0.001 wt. % to about 0.1 wt. %, and more preferably about 0.005 wt. % to about 0.05 wt. %).

The polishing composition can comprise an antifoaming agent. The antifoaming agent can comprise, consist essentially of, or consist of any suitable anti-foaming agent. Suitable antifoaming agents include, but are not limited to, silicon-based and acetylenic diol-based antifoaming agents. The amount of anti-foaming agent in the polishing composition typically is about 10 ppm to about 140 ppm.

The polishing composition can comprise a biocide. The biocide can comprise, consist essentially of, or consist of any suitable biocide, for example an isothiazolinone biocide. The amount of biocide in the polishing composition typically is about 1 to about 50 ppm, preferably about 10 to about 20 ppm.

The polishing composition preferably is colloidally stable. The term colloid refers to the suspension of the particles in the liquid carrier. Colloidal stability refers to the maintenance of that suspension through time. A polishing composition is considered colloidally stable if, when the polishing composition is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the polishing composition ([C] in terms of g/ml) is less than or equal to 0.5 (i.e., $\{[B]-[T]\}/[C] \leq 0.5$). Preferably, the value of $[B]-[T]/[C]$ is less than or equal to 0.3, more preferably is less than or equal to 0.1, even more preferably is less than or equal to 0.05, and most preferably is less than or equal to 0.01.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., liquid carrier, abrasive, acid, etc.) as well as any combination of ingredients (e.g., water, treated abrasives, surfactants, etc.).

The polishing composition can be supplied as a one-package system comprising a liquid carrier, and optionally an abrasive and/or other additives. Alternatively, some of the components, such as an oxidizing agent, can be supplied in a first container, either in dry form, or as a solution or dispersion in the liquid carrier, and the remaining components, such as the abrasive and other additives, can be supplied in a second container or multiple other containers. Other two-container, or three or more container combinations of the components of the polishing composition are within the knowledge of one of ordinary skill in the art.

Solid components, such as an abrasive, can be placed in one or more containers either in dry form or as a solution in the liquid carrier. Moreover, it is suitable for the components in the first, second, or other containers to have different pH values, or alternatively to have substantially similar, or even equal, pH values. The components of the polishing composition can be partially or entirely supplied separately from each other and can be combined, e.g., by the end-user, shortly before use (e.g., 1 week or less prior to use, 1 day or less prior to use, 1 hour or less prior to use, 10 minutes or less prior to use, or 1 minute or less prior to use).

The polishing composition also can be provided as a concentrate which is intended to be diluted with an appropriate amount of liquid carrier prior to use. In such an embodiment, the polishing composition concentrate can comprise a liquid carrier, and optionally other components in amounts such that, upon dilution of the concentrate with an appropriate amount of liquid carrier, each component will be present in the polishing composition in an amount within the appropriate range recited above for each component. For example, each component can be present in the concentrate in an amount that is about 2 times (e.g., about 3 times, about 4 times, or about 5 times) greater than the concentration recited above for each component in the polishing composition so that, when the concentrate is diluted with an appropriate volume of liquid carrier (e.g., an equal volume of liquid carrier, 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the polyether amine and other suitable additives, such as an abrasive, are at least partially or fully dissolved or suspended in the concentrate.

The inventive method of polishing a substrate is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention (which generally is disposed between the substrate and the polishing pad), with the polishing pad moving relative to the substrate, so as to abrade at least a portion of the substrate to polish the substrate.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Desirably, the inspection or monitoring of the progress of the polishing process with respect to a substrate being polished enables the determination of the polishing end-point, i.e., the determination of when to terminate the polishing process with respect to a particular substrate. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643.

Polishing refers to the removal of at least a portion of a surface to polish the surface. Polishing can be performed to provide a surface having reduced surface roughness by removing gouges, crates, pits, and the like, but polishing also can be performed to introduce or restore a surface geometry characterized by an intersection of planar segments.

The substrate to be polished using the method of the invention can be any suitable substrate. Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads. The substrate can comprise multiple layers, e.g., an insulating layer, a conducting layer. The insulating layer can be a metal oxide, porous metal oxide, glass, organic polymer, fluorinated organic polymer, or any other suitable high or low-κ insulating layer. The insulating layer can comprise, consist of, or consist essentially of silicon oxide, silicon nitride, or combinations thereof. The silicon oxide can be any suitable silicon oxide, many of which are known in the art. Suitable types of silicon oxide include but are not limited to borophosphosilicate glass (BPSG), plasma-enhanced tetraethyl ortho silicate (PETEOS), thermal oxide, undoped silicate glass, carbon doped silicon oxide (CDO), fluorine doped silicon oxide (FSG), and high density plasma (HDP) oxide. The substrate can further comprise at least one additional insulating layer. The at least one additional insulating layer can comprise, consist of, or consist essentially of silicon oxide, silicon nitride, or combinations thereof. The substrate can further comprise a metal layer. The metal layer can comprise, consist essentially of, or consist of any suitable metal, many of which are known in the art, such as, for example, tungsten, tantalum, titanium, ruthenium, copper, aluminum.

The method of the invention is particularly useful in polishing a substrate comprising at least one layer of silicon oxide. The silicon oxide layer can be removed at a rate of about 100 Å/min or more (e.g., about 300 Å/min or more, about 400 Å/min or more, about 500 Å/min or more, about 600 Å/min or more, or about 800 Å/min or more). The silicon oxide layer can be removed at a rate of about 5000 Å/min or less (e.g., about 3000 Å/min or less, about 2000 Å/min or less, about 1000 Å/min or less, about 800 Å/min or less, or about 500 Å/min or less). Accordingly, the silicon oxide layer can be removed from the substrate at a rate of about 200 Å/min to about 5000 Å/min (e.g., about 300 Å/min to about 2000 Å/min, about 600 Å/min to about 5000 Å/min, about 400 Å/min to about 1500 Å/min, about 500 Å/min to about 1000 Å/min, or about 500 Å/min to about 800 Å/min).

The method of the invention also is particularly useful in polishing a substrate comprising at least one layer of silicon nitride. The silicon nitride layer can be removed at a rate of about 100 Å/min or more (e.g., about 300 Å/min or more, about 400 Å/min or more, about 500 Å/min or more, about 600 Å/min or more, or about 800 Å/min or more). The silicon nitride layer can be removed at a rate of about 3000 Å/min or less (e.g., about 2000 Å/min or less, about 1500 Å/min or less, about 1000 Å/min or less, about 800 Å/min or less, or about 500 Å/min or less). Accordingly, the silicon nitride layer can be removed from the substrate at a rate of about 100 Å/min to about 3000 Å/min (e.g., about 100 Å/min to about 2000 Å/min, about 100 Å/min to about 1500 Å/min, about 200 Å/min to about 1500 Å/min, about 300 Å/min to about 1000 Å/min, or about 500 Å/min to about 800 Å/min).

The substrate can comprise at least one layer of silicon nitride and at least one layer of silicon oxide, wherein the silicon oxide layer is selectively removed relative to the layer of silicon nitride, wherein the silicon nitride layer is selectively removed relative to the layer of silicon oxide, or wherein the silicon nitride layer is removed at a similar rate relative to the layer of silicon oxide.

The following examples further illustrate the invention but, of course, should not be construed as in any way limiting its scope. All data in the following examples was generated on a Logitech polisher using an IC 1000 pad and 1.6 inch wafers at a polishing downforce of 28 kPa (4 psi).

Example 1

This example demonstrates the effect on the removal rate of silicon oxide and silicon nitride by the pH of a polishing composition containing colloidal silica particles which have been treated with an aminosilane compound.

A TEOS wafer, a BPSG wafer, and a silicon nitride wafer were polished with ten different polishing compositions. Each polishing composition contained 1 wt. % colloidal silica that was treated with 300 ppm aminopropyl triethoxysilane. For polishing compositions 1A-1J, the aminopropyl triethoxysilane was mixed with water for 30 minutes, then the silica was added, and the resulting dispersion was stirred for 2 hours. For polishing compositions 1G-1J, the pH was adjusted to 4 with nitric acid prior to the addition of the silane. The pH of each polishing composition was then adjusted to the target pH with nitric acid, except for polishing compositions 1A and 1G that did not contain any additional nitric acid. The pH of each polishing composition is indicated in Table 1.

The silicon oxide removal rate (Å/min) for both the TEOS and BPSG wafers and the silicon nitride removal rate (Å/min) were determined for each polishing composition, and the results are shown in Table 1.

TABLE 1

| Polishing Composition | pH | Silicon Oxide Removal Rate (Å/min) (TEOS) | Silicon Oxide Removal Rate (Å/min) (BPSG) | Silicon Nitride Removal Rate (Å/min) |
|---|---|---|---|---|
| 1A | 8.33 | 1826 | 4048 | 40 |
| 1B | 6.06 | 2282 | 4010 | 42 |
| 1C | 4.91 | 2233 | 4259 | 16 |
| 1D | 4.4 | 14 | 3759 | 11 |
| 1E | 3.52 | 14 | 3743 | 7 |
| 1F | 4.02 | 77 | — | 10 |
| 1G | 5.73 | 1890 | — | 104 |
| 1H | 4.24 | 1343 | — | 20 |
| 1I | 5.1 | 2217 | — | 41 |
| 1J | 3.76 | 441 | — | 22 |

As is apparent from the data presented in Table 1, the pH of the polishing composition can be adjusted to alter the polishing rate of both silicon oxide and silicon nitride.

Example 2

This example demonstrates the effect on the removal rate of silicon oxide and silicon nitride by the pH of a polishing composition containing an acid and colloidal silica particles which have been treated with an aminosilane compound.

A TEOS wafer and a silicon nitride wafer were polished with twenty-two different polishing compositions. Polishing compositions 2A-2M contained 1 wt. % colloidal silica (50 nm) that was treated with 300 ppm aminopropyl triethoxysilane. Polishing compositions 2N-2Q contained 1 wt. % colloidal silica that was untreated. Polishing compositions 2R-2V contained 1 wt. % colloidal silica (35 nm) treated with 250 ppm bis(trialkoxysilylpropyl)amine, 1% hydrogen peroxide, and nitric acid, which was used to adjust the pH to that indicated below in Table 2. The pH of each polishing composition and the type and amount of acid that was added to each composition are indicated in Table 2.

The silicon oxide removal rate (Å/min) and the silicon nitride removal rate (Å/min) were determined for each polishing composition, and the results are shown in Table 2.

TABLE 2

| Polishing Composition | pH | Acid Concentration | Silicon Oxide Removal Rate (Å/min) | Silicon Nitride Removal Rate (Å/min) |
|---|---|---|---|---|
| 2A | 8.1 | 40 ppm Dequest 2010 | 1152 | 55 |
| 2B | 8.1 | 10 ppm phosphoric acid | 1215 | 63 |
| 2C | 5 | 118 ppm phosphoric acid | 1977 | 41 |
| 2D | 3.5 | 183 ppm phosphoric acid | 26 | 25 |
| 2E | 2.33 | 750 ppm phosphoric acid | 23 | 47 |
| 2F | 7.91 | 50 ppm Dequest 2000 | 1322 | 77 |
| 2G | 4.96 | 270 ppm Dequest 2000 | 326 | 314 |
| 2H | 3.92 | 250 ppm Dequest 2000 | 258 | 486 |
| 2I | 2.35 | 1000 ppm Dequest 2000 | 545 | 726 |
| 2J | 7.95 | 38 ppm phthalic acid | 1152 | 56 |
| 2K | 3.85 | 291 ppm phthalic acid | 75 | 16 |
| 2L | 2.92 | 790 ppm phthalic acid | 4 | 9 |
| 2M | 2.9 | 946 ppm phthalic acid | 29 | 10 |
| 2N | 7.5 | 15 ppm nitric acid | 8 | 0 |
| 2O | 5 | 20 ppm nitric acid | 31 | 1 |
| 2P | 3.5 | 60 ppm nitirc acid | 84 | 368 |
| 2Q | 2.5 | 220 ppm nitric acid | 380 | 62 |
| 2R | 6.0 | 300 ppm boric acid | 1645 | — |
| 2S | 5.0 | 300 ppm boric acid | 1198 | — |
| 2T | 4.0 | 300 ppm boric acid | 1174 | — |
| 2U | 3.0 | 300 ppm boric acid | 677 | — |
| 2V | 2.2 | 300 ppm boric acid | 381 | — |

As is apparent from the data presented in Table 2, the pH of the polishing composition can be adjusted using several different acids to selectively remove either silicon oxide or silicon nitride.

Example 3

This example demonstrates the effect on the removal rate of silicon oxide and silicon nitride by the pH and acid concentration of a polishing composition containing colloidal silica particles which have been treated with an aminosilane compound.

A TEOS wafer and a silicon nitride wafer were polished with fifteen different polishing compositions. Each of the polishing compositions contained 1 wt. % colloidal silica that was treated with 300 ppm aminopropyl triethoxysilane. The pH of polishing compositions 3A-3D was adjusted to 9 before the addition of the silane and the pH of polishing compositions 3E-3O was 7.5 before the addition of the silane. The final pH of each polishing composition and the amount of 1-hydroxyethylidene-1,1-diphosphonic acid (DEQUEST 2010) that was added to each composition are indicated in Table 3.

The silicon oxide removal rate (Å/min) and the silicon nitride removal rate (Å/min) were determined for each polishing composition, and the results are shown in Table 3.

TABLE 3

| Polishing Composition | pH | DEQUEST 2010 Concentration (ppm) | Silicon Oxide Removal Rate (Å/min) | Silicon Nitride Removal Rate (Å/min) | Zeta Potential (mV) |
| --- | --- | --- | --- | --- | --- |
| 3A | 9.14 | 0 | 91 | 0 | −27 |
| 3B | 8.06 | 50 | 735 | 11 | 3 |
| 3C | 7.21 | 100 | 998 | 72 | 15 |
| 3D | 6.64 | 150 | 1237 | 148 | 18 |
| 3E | 8.43 | 0 | 331 | 39 | 35 |
| 3F | 8.15 | 23 | 1008 | 24 | 35 |
| 3G | 7.43 | 49 | 859 | 48 | 35 |
| 3H | 6.73 | 106 | 1104 | 109 | 36 |
| 3I | 6.16 | 163 | 1378 | 167 | 34 |
| 3J | 5.13 | 196 | 1180 | 268 | 39 |
| 3K | 4.09 | 223 | 1130 | 461 | 23 |
| 3L | 3.05 | 272 | 800 | 575 | 31 |
| 3M | 2.81 | 372 | 1050 | 675 | — |
| 3N | 2.5 | 820 | 652 | 759 | — |
| 3O | 2.27 | 1578 | 543 | 809 | — |

As is apparent from the data presented in Table 3, the pH of the inventive polishing composition can be adjusted using different concentrations of acid to selectively remove either silicon oxide or silicon nitride.

Example 4

This example demonstrates the effect on the removal rate of silicon oxide and silicon nitride by a polishing composition containing colloidal silica particles which have been treated with an aminosilane compound and a phosphorus-containing acid.

A TEOS wafer and a silicon nitride wafer were polished with four different polishing compositions. Each of the polishing compositions contained 3 wt. % colloidal silica that was treated with 800 ppm aminoalkyl siloxane. Nitric acid was added to polishing compositions 4A and 4C to adjust the pH to 2.2. The pH of each polishing composition and the type and amount of acid that was added to each composition are indicated in Table 4.

The silicon oxide removal rate (Å/min) and the silicon nitride removal rate (Å/min) were determined for each polishing composition, and the results are shown in Table 4.

TABLE 4

| Polishing Composition | pH | Acid Concentration | Silicon Oxide Removal Rate (Å/min) | Silicon Nitride Removal Rate (Å/min) |
| --- | --- | --- | --- | --- |
| 4A | 2.2 | 7.28 mM DEQUEST 2000 | 605 | 970 |
| 4B | 3.2 | 7.28 mM DEQUEST 2000 | 1170 | 964 |
| 4C | 2.2 | 7.28 mM DEQUEST 2010 | 539 | 1023 |
| 4D | 3.2 | 7.28 mM DEQUEST 2010 | 1620 | 989 |

As is apparent from the data presented in Table 4, the pH and type of acid used in the polishing composition can be adjusted to selectively remove either silicon oxide or silicon nitride.

Example 5

This example demonstrates the effect on the removal rate of silicon oxide and silicon nitride by a polishing composition containing colloidal silica particles which have been treated with an aminosilane compound.

A TEOS wafer and a silicon nitride wafer were polished with twelve different polishing compositions. Each of the polishing compositions contained colloidal silica that was treated with aminopropyl triethoxysilane and 1000 ppm 1-hydroxyethylidene-1,1-diphosphonic acid (DEQUEST 2010). The amount of aminopropyl triethoxysilane and colloidal silica that were added to each composition and the pH of each composition are indicated in Table 5.

The silicon oxide removal rate (Å/min) and silicon nitride removal rate (Å/min) were determined for each polishing composition, and the results are shown in Table 5.

TABLE 5

| Polishing Composition | pH | Silica (wt. %) | Aminopropyl triethoxysilane (ppm) | Silicon Oxide Removal Rate (Å/min) | Silicon Nitride Removal Rate (Å/min) | Zeta Potential (mV) |
| --- | --- | --- | --- | --- | --- | --- |
| 5A | 2.36 | 1 | 150 | 397 | 771 | 29.4 |
| 5B | 2.35 | 1 | 240 | 653 | 787 | 29.3 |
| 5C | 2.37 | 1 | 300 | 821 | 822 | 28.6 |
| 5D | 2.35 | 1 | 360 | 869 | 782 | 31.3 |
| 5E | 2.43 | 1 | 420 | 929 | 829 | 30.9 |
| 5F | 2.47 | 1 | 500 | 776 | 798 | 30.2 |
| 5G | 2.32 | 0.5 | 120 | 420 | 694 | 22.8 |
| 5H | 2.34 | 0.5 | 150 | 637 | 728 | 31.9 |
| 5I | 2.31 | 0.5 | 180 | 676 | 753 | 30.5 |

TABLE 5-continued

| Polishing Composition | pH | Silica (wt. %) | Aminopropyl triethoxysilane (ppm) | Silicon Oxide Removal Rate (Å/min) | Silicon Nitride Removal Rate (Å/min) | Zeta Potential (mV) |
|---|---|---|---|---|---|---|
| 5J | 2.55 | 3 | 720 | 1451 | 954 | 29.1 |
| 5K | 2.64 | 3 | 900 | 1586 | 927 | 29.5 |
| 5L | 2.73 | 3 | 1080 | 1505 | 912 | 36.6 |

As is apparent from the data presented in Table 5, the silicon oxide removal rate increased as the amount of aminopropyl triethoxysilane increased, up to at least a concentration of about 500 ppm. The concentration of aminopropyl triethoxysilane had relatively little effect on the silicon nitride removal rate. Both the silicon oxide removal rate and the silicon nitride removal rate increased as the concentration of colloidal silica in the polishing composition increased.

Example 6

This example demonstrates the effect on the removal rate of silicon oxide and silicon nitride by a polishing composition containing silica particles which have been treated with an aminosilane compound.

A TEOS wafer and a silicon nitride wafer were polished with eighteen different polishing compositions. Each of the polishing compositions contained 3 wt. % silica that was treated with aminopropyl triethoxysilane and 1500 ppm 1-hydroxyethylidene-1,1-diphosphonic acid (DEQUEST 2010). The type of silica particles and amount of aminopropyl triethoxysilane that was added to each composition in addition to the zeta potential of the particles are indicated in Table 6.

The silicon oxide removal rate (Å/min) and silicon nitride removal rate (Å/min) were determined for each polishing composition, and the results are shown in Table 6.

TABLE 6

| Polishing Composition | Silica Type | Aminopropyl triethoxysilane (ppm) | Silicon Oxide Removal Rate (Å/min) | Silicon Nitride Removal Rate (Å/min) | Zeta Potential (mV) |
|---|---|---|---|---|---|
| 6A | 46 nm colloidal sol gel | 300 | 761 | — | — |
| 6B | 46 nm colloidal sol gel | 600 | 905 | 1147 | 36 |
| 6C | 46 nm colloidal sol gel | 0 | 629 | — | — |
| 6D | 50 nm colloidal silicate ion exchange | 300 | 508 | — | — |
| 6E | 50 nm colloidal silicate ion exchange | 600 | 1309 | 816 | 32 |
| 6F | 50 nm colloidal silicate ion exchange | 0 | 297 | — | — |
| 6G | 80 nm colloidal silicate ion exchange | 300 | 612 | — | — |
| 6H | 80 nm colloidal silicate ion exchange | 600 | 1022 | 969 | 40 |
| 6I | 80 nm colloidal silicate ion exchange | 0 | 542 | — | — |
| 6J | 150 nm fumed | 300 | 207 | — | — |
| 6K | 150 nm fumed | 600 | 279 | 132 | 34 |
| 6L | 150 nm fumed | 0 | 179 | — | — |
| 6M | 47 nm colloidal silicate ion exchange | 300 | 398 | — | — |
| 6N | 47 nm colloidal silicate ion exchange | 600 | 633 | 805 | 30 |
| 6O | 47 nm colloidal silicate ion exchange | 0 | 209 | — | — |
| 6P | 32 nm colloidal silicate ion exchange | 300 | 813 | — | — |
| 6Q | 32 nm colloidal silicate ion exchange | 600 | 1458 | 597 | 30 |

TABLE 6-continued

| Polishing Composition | Silica Type | Aminopropyl triethoxysilane (ppm) | Silicon Oxide Removal Rate (Å/min) | Silicon Nitride Removal Rate (Å/min) | Zeta Potential (mV) |
|---|---|---|---|---|---|
| 6R | 32 nm silicate ion exchange | 0 | 887 | | — |

As is apparent from the data presented in Table 6, treatment of colloidal silica particles synthesized using the sol gel method and 46 nm, 50 nm, and 80 nm colloidal silica particles synthesized using silicate ion exchange were effective in polishing silicon oxide substrates, whereas fumed silica particles were not so effective in polishing silicon oxide substrates. The 32 nm colloidal silica particles were effective in polishing silicon oxide substrates when a sufficient concentration of the aminosilane was used to treat the particles.

Example 7

This example demonstrates the effect on the removal rate of silicon oxide by a polishing composition containing silica particles which have been treated with an aminosilane compound.

A TEOS wafer was polished with seven different polishing compositions. Each of the polishing compositions was adjusted to a pH of 5.1 with nitric acid and contained colloidal silica that was treated with aminopropyl triethoxysilane. The amount of colloidal silica that was added to each composition is indicated in Table 7.

The silicon oxide removal rate (Å/min) was determined for each polishing composition, and the results are shown in Table 7.

TABLE 7

| Polishing Composition | Silica (wt. %) | Silicon Oxide Removal Rate (Å/min) | Zeta Potential (mV) |
|---|---|---|---|
| 7A | 10 | 2677 | 34 |
| 7B | 6 | 2457 | 36 |
| 7C | 4 | 2530 | 37 |
| 7D | 2 | 2656 | 32 |
| 7E | 1 | 2525 | — |
| 7F | 0.5 | 2445 | — |
| 7G | 0.2 | 1741 | — |

As is apparent from the data presented in Table 7, the silicon oxide removal rate increased as the amount of colloidal silica increased up to about 2 wt. % colloidal silica.

Example 8

This example demonstrates the average particle size and surface coverage of available silanols on treated particles in polishing compositions containing colloidal silica particles which have been treated with various amounts of an aminosilane compound.

Each of the polishing compositions was prepared as described in Example 5. The amounts of aminopropyl triethoxysilane and colloidal silica that were added to each composition and the pH of each composition are indicated in Table 8. The size of the treated particles was measured using a Malvern HS 3000 after 5 days. The silane left in solution was measured after 5 days by centrifuging the slurry and analyzing the centrate by derivatizing the primary amines on the aminosilane with the 6-aminoquinoly-N-hydroxysuccinimidyl carbamate (AccQ Tag made by Waters) and quantifying using reverse phase HPLC. The amount of silane on the treated particles was calculated as the difference between the amount of silane that was added to the polishing composition minus the amount of silane remaining in solution after treatment. The surface coverage is the amount of silane on the surface of the treated particles divided by the silanols on the particle surface and is represented as a percentage. The number of silanols on the surface of the particles was determined by measuring the BET surface area of the silica (117 m$^2$/g) and using a typical silanol density for colloidal silica of 5 silanols per nm$^2$.

The average particle size, amount of silane on the particles, and the surface coverage of the particles were determined for each polishing composition, and the results are shown in Table 8.

TABLE 8

| Polishing Composition | pH | Silica (wt. %) | Aminopropyl triethoxysilane (ppm) | Average Particle Size (nm) | Silane on Particle (ppm) | Surface Coverage (%) |
|---|---|---|---|---|---|---|
| 8A | 2.36 | 1 | 150 | 50 | 116 | 5% |
| 8B | 2.35 | 1 | 240 | 49 | 175 | 8% |
| 8C | 2.37 | 1 | 300 | 50 | 212 | 10% |
| 8D | 2.35 | 1 | 360 | 54 | 239 | 11% |
| 8E | 2.43 | 1 | 420 | 64 | 309 | 14% |
| 8F | 2.47 | 1 | 500 | 129 | 309 | 14% |
| 8G | 2.32 | 0.5 | 120 | 50 | 86 | 8% |
| 8H | 2.34 | 0.5 | 150 | 50 | 95 | 9% |
| 8I | 2.31 | 0.5 | 180 | 51 | 119 | 11% |
| 8J | 2.55 | 3 | 720 | 53 | 570 | 9% |
| 8K | 2.64 | 3 | 900 | 57 | 687 | 11% |
| 8L | 2.73 | 3 | 1080 | 110 | 809 | 13% |

As is apparent from the data presented in Table 8, the percent surface coverage on the particles increases as the amount of aminopropyl triethoxysilane is increased relative to the amount of silica. The particle size remained relatively stable at lower silane concentrations, but increased with higher silane levels relative to the amount of silica.

Example 9

This example demonstrates the effect on silicon oxide removal rate by the treated particle size and the value of the silane added divided by the number of silanols on the surface of particles in polishing compositions containing colloidal silica particles which have been treated with various amounts of an aminosilane compound.

Each of the polishing compositions contained 0.3% colloidal silica (45 nm) that was treated with bis(trimethoxysilylpropyl)amine, 100 ppm boric acid, and was adjusted to a pH of 3.5 with nitric acid. The amount of bis(trimethoxysilylpropyl)amine that was added to each composition is indicated in Table 9. The zeta potential and size of the treated particles were measured using a Malvern HS 3000. The amount of silane left in solution was measured after 2 months by centrifuging the compositions and analyzing the centrate using LC-mass spectroscopy in the positive ion mode. The amount of silane on the treated particles was calculated as the difference between the amount of silane that was added to the polishing composition minus the amount of silane remaining in solution after treatment. The surface coverage is the amount of silane on the surface of the treated particles divided by the silanols on the particle surface and is represented as a percentage. The number of silanols on the surface of the particles was determined by measuring the BET surface area of the silica (87 m$^2$/g) and using a typical silanol density for colloidal silica of 5 silanols per nm$^2$.

The zeta potential, average particle size, surface coverage, and the silicon oxide removal rate were determined for each polishing composition, and the results are shown in Table 9.

TABLE 9

| Polishing Composition | Aminopropyl triethoxysilane (ppm) | Zeta Potential (mV) | Average Particle Size (nm) | Surface Coverage (%) | Silicon Oxide Removal rate (Å/min) |
|---|---|---|---|---|---|
| 9A | 0 | −19 | 49 | 0 | 32 |
| 9B | 10 | 4 | 50 | 3 | 761 |
| 9C | 20 | 18 | 58 | 5 | 1173 |
| 9D | 30 | 21 | 63 | 8 | 1123 |
| 9E | 120 | 18 | 52 | 27 | 1153 |
| 9F | 150 | — | 52 | 32 | 1017 |
| 9G | 190 | — | 69 | 38 | 864 |
| 9H | 230 | 39 | 53 | 46 | 696 |
| 9I | 300 | — | 141 | 59 | 44 |
| 9J | 400 | 41 | 483 | 81 | 20 |

As is apparent from the data presented in Table 9, the silicon oxide removal rate rapidly increases as the percent surface coverage on the particles increases to about 5%, and then remains substantially unchanged at a relatively high level when the percent surface coverage is increased from about 5% to about 32%, then begins to decrease as the percent surface coverage on the particles continues to increase. The average particle size remains relatively stable at silane concentrations of about 200 ppm or less (e.g., a percent surface coverage of about 45%), but begins to increase at higher silane concentrations.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate, which method comprises:
 (i) contacting a substrate with a chemical-mechanical polishing composition comprising:
  (a) a liquid carrier, and
  (b) an abrasive suspended in the liquid carrier, wherein the abrasive comprises wet-process silica particles having a surface which has been treated with a compound selected from the group consisting of quaternary aminosilane compounds, dipodal aminosilane compounds, and combinations thereof,
 (ii) moving the polishing composition relative to the substrate, and
 (iii) abrading at least a portion of the substrate to polish the substrate, wherein the substrate comprises at least one layer of silicon oxide or at least one layer of silicon nitride, and wherein at least a portion of the silicon oxide or silicon nitride is removed from the substrate to polish the substrate.

2. The method of claim 1, wherein the polishing composition has a pH of about 7 to about 9.

3. The method of claim 1, wherein the substrate comprises at least one layer of silicon oxide, and wherein at least a portion of the silicon oxide is removed from the substrate to polish the substrate.

4. The method of claim 1, wherein the compound is selected from the group consisting of trialkoxysilyl propyl-N,N,N-trimethyl ammonium chloride, N-(trialkoxysilylethyl)benzyl-N,N,N-trimethyl ammonium chloride, bis(methyldialkoxysilylpropyl)-N-methyl amine, bis(trialkoxysilylpropyl) urea, bis(3-(trialkoxysilyl)propyl)-ethylenediamine, and bis(trialkoxysilylpropyl)amine.

5. The method of claim 1, wherein the substrate comprises at least one layer of silicon oxide, and wherein at least a portion of the silicon oxide is removed from the substrate to polish the substrate.

6. The method of claim 1, wherein the substrate comprises at least one layer of silicon nitride, and wherein at least a portion of the silicon nitride is removed from the substrate to polish the substrate.

7. The method of claim 1, wherein the substrate comprises silicon oxide and silicon nitride, and the silicon oxide is selectively removed from the substrate relative to the silicon nitride.

* * * * *